United States Patent [19]

Kim

[11] Patent Number: 5,789,116
[45] Date of Patent: Aug. 4, 1998

[54] HALF-TONE PHASE SHIFT MASKS AND FABRICATING METHODS THEREFOR INCLUDING PHASE SHIFTER PATTERN AND PHASE SHIFTING GROOVE

[75] Inventor: Hyoung-joon Kim, Seoul, Rep. of Korea

[73] Assignee: Samsung Electronic Co., Ltd., Suwon, Rep. of Korea

[21] Appl. No.: 774,106

[22] Filed: Dec. 24, 1996

[30] Foreign Application Priority Data

Dec. 26, 1995 [KR] Rep. of Korea .................. 95-56970

[51] Int. Cl.$^6$ ...................................... G03F 9/00
[52] U.S. Cl. ............................................ 430/5
[58] Field of Search .................. 630/5, 322, 324

[56] References Cited

U.S. PATENT DOCUMENTS

| | | | |
|---|---|---|---|
| 4,820,607 | 4/1989 | Aoai | 430/190 |
| 5,437,947 | 8/1995 | Hur et al. | 430/5 |
| 5,480,747 | 1/1996 | Vasudev | 430/5 |

FOREIGN PATENT DOCUMENTS 0 645 679 A1  3/1995  European Pat. Off. .

OTHER PUBLICATIONS

Notification D'un Rapport de Recherche Preliminates Sans Responsde Obligatoire (Preliminary Search Report), FR 9710393, Dec.12, 1997.

Kang et al., "*Chemically Amplified Silicon Containing Resist for ArF Excimer Laser Lithography*", Journal of Photopolymer Science and Technology, vol. 10, No. 4, Jun. 24, 1997, pp. 585–588.

*Primary Examiner*—S. Rosasco
*Attorney, Agent, or Firm*—Myers Bigel Sibley & Sajovec

[57] ABSTRACT

Half-tone phase shift masks (PSM) having a high transmittance and can be easy to fabricate are provided. The half-tone PSM includes a substrate which is transparent with respect to exposure light, a phase shifter pattern formed on the transparent substrate, and a phase shifting groove which can be formed by etching the transparent substrate. Methods for fabricating half-tone PSMs are also provided. The half-tone PSM can have a higher transmittance than that of a conventional half-tone PSM, and the phase shifting groove can have a uniform surface. Thus, a fine pattern having an excellent contrast can be formed using a short wavelength.

25 Claims, 3 Drawing Sheets

5,789,116

1

HALF-TONE PHASE SHIFT MASKS AND FABRICATING METHODS THEREFOR INCLUDING PHASE SHIFTER PATTERN AND PHASE SHIFTING GROOVE

FIELD OF THE INVENTION

The present invention relates to phase shift masks and fabricating methods therefor, and more particularly, to half-tone phase shift masks which are suitable for forming a fine pattern and which can be easily manufactured.

BACKGROUND OF THE INVENTION

As semiconductor devices become more highly integrated, it becomes difficult to form patterns with a line width below a predetermined limit using a conventional photo mask. Thus, a phase shift mask (PSM) which enables a pattern having superior resolution and reduced critical dimension (CD) has been studied actively.

The PSM generally comprises a phase shifter which is not generally included in a conventional mask. In a method for forming a pattern using the PSM, the phase of exposure light passing through a phase shifter defining a pattern to be transcribed onto a semiconductor substrate, and that of exposure light passing through a portion of the substrate free of the phase shifter, make a difference of an angle of 180°. Thus, they interfere to make an offset on the edge of the pattern, thereby improving contrast of the pattern.

A half-tone PSM is made of a phase shift material for shifting a phase by an angle of 180° and which is semitransparent, having a transmittance of 30% or below against the exposure light. The reason why the phase shifter should be semitransparent against the exposure light is that, if the light transmitted through the phase shifter has such intensity as to expose a photoresist film to light, the formation of the pattern may be difficult. MoSiON or a Cr oxide is typically used as the half-tone phase shift material. The half-tone PSM can be easily manufactured and then effectively applied to the formation of a pattern in which a line-space repeats at high density and a contact hole having a fine aperture.

FIG. 1 shows a conventional half-tone PSM wherein a MoSiON phase shifter 3 having a thickness of d1 is formed on a transparent substrate 1.

In the half-tone PSM, the phase difference between exposure light passing through the substrate 1 and that passing through the MoSiON half-tone phase shifter 3 is determined by Equation 1, and the transmittance of the exposure light against the MoSiON half-tone phase shifter 3 is determined by Equation 2.

$$\Delta\Phi=2\pi(n-1)d1/\lambda \quad \text{Equation 1}$$

$$T=\exp(-4\pi k d1/\lambda) \quad \text{Equation 2}$$

Here, $\Delta\Phi$ denotes phase difference, n denotes a refractive index of the phase shifter, $\lambda$ denotes a wavelength of the exposure light, d1 denotes a thickness of the MoSiON half-tone phase shifter, and k denotes an extinction coefficient of the exposure light.

In a photolithography process using a molybdenum half-tone PSM, when a deep ultraviolet (DUV) radiation of 248 nm or an ArF excimer laser of 193 nm is used as the exposure light, at the thickness d1 of the MoSiON half-tone phase shifter 3 which makes a value of $\Delta\Phi$ in Equation 1 180°, a value k that enables the light to transmit over 5% through the MoSiON half-tone phase shifter 3 cannot be obtained. This is because the values n and k varying according to the wavelength of light are fixed for respective material and the value k is increased as the wavelength becomes shorter so that the transmittance is lowered. Thus, when the MoSiON half-tone PSM uses a short wavelength light source, the effects of phase shift are reduced.

In order to solve the problem of the reduction of transmittance, a modified half-tone PSM as shown in FIG. 2 has been proposed.

Referring to FIG. 2, a chromium film pattern 13 for adjusting transmittance is formed on a transparent substrate 11. The substrate 11 is etched to a depth D1 using the chromium film pattern 13 as an etching mask, thereby forming a phase shifting groove 15.

In the MoSiON half-tone PSM shown in FIG. 1, since the MoSiON half-tone phase shifter has values n and k at which phase shift can occur while adjusting the transmittance appropriately, only the MoSiON half-tone phase shifter layer can form a half-tone PSM. However, since the chromium film has no values of n and k at which phase shift can occur while adjusting the transmittance appropriately, the transmittance adjustment generally is only carried out by the chromium film pattern 13, and the phase shift is performed by the phase shifting groove 15 formed by etching the substrate 11. That is, the transmittance is increased by reducing the thickness of the chromium film pattern 13. Also, the value of the phase shift is maintained at an angle of 180° by adjusting the depth D1 of the phase shifting groove 15. In this case, the substrate-etching depth D1 can be easily obtained using an equation of $D1=\lambda/2(N-1)$ by substituting $\pi$ for the $\Delta\Phi$ in Equation 1. Here, N denotes the refractive index of the substrate 11.

For example, when a light source having a wavelength of 248 nm is used as an exposure light and the substrate 11 is formed of quartz, since the value N of the quartz is about 1.5, the etching depth D1 of the substrate 11 becomes 2480 Å.

The half-tone PSM shown in FIG. 2 is advantageous for the transmittance adjustment. However, when a transparent substrate is etched to cause the phase shift, since the etching depth is so deep, it is difficult to etch uniformly. Accordingly, the surface of the phase shifting groove 15 becomes uneven so that the phase of transmitted light is shifted irregularly.

SUMMARY OF THE INVENTION

It is therefore an object of the present invention to provide phase shift masks which are suitable for the formation of a fine pattern and which can be easily fabricated.

It is another object of the present invention to provide methods for fabricating phase shift masks.

These and other objects are provided, according to the invention, by half-tone phase shift masks comprising a substrate which is transparent with respect to exposure light; a phase shifter pattern formed on the transparent substrate; and a phase shifting groove on the transparent substrate.

The phase shifter pattern is of a thickness d to have transmittance between 5 and 30% T against the exposure light. Here, the thickness d is determined by the following equation: $d=-\lambda\ln T/4\pi k$, wherein "k" denotes an extinction coefficient of the exposure light by the phase shifter pattern, and "$\lambda$" denotes a wavelength of the exposure light.

It is preferable that the phase shifter pattern is formed of a material selected from the group consisting of MoSiON, $SiN_x$, amorphous carbon, and CrF.

The phase shifting groove is of a depth of D so that a phase difference ($\Delta\Phi$) between exposure light passing through the phase shifting groove and that passing through the phase shifter pattern ranges between 90° and 270°. Here, the depth D is determined by the following equation: $D=\{\lambda/2(N-1)\}-\{2(n-1)d/2(N-1)\}$, wherein "N" is a refractive index of the substrate, "n" is a refractive index of the phase shifter pattern, "$\lambda$" is a wavelength of exposure light, and "d" is a thickness of the phase shifter pattern.

The phase shift masks also preferably include a light shielding film pattern on a predetermined area of the phase shifter pattern. Also, preferably, the light shielding film pattern has a transmittance of 5 to 30% T against the exposure light, and is formed of a material selected from the group consisting of chromium (Cr), aluminum (Al) and MoSi.

Methods for fabricating half-tone phase shift masks, according to the invention, comprise the steps of: forming a phase shifter pattern on a substrate which is transparent with respect to exposure light; and forming a phase shifting groove by etching the substrate using the phase shifter pattern as an etching mask.

Other methods for fabricating half-tone phase shift masks, according to the invention, comprise the steps of: forming a phase shifter film on a substrate which is transparent with respect to exposure light; forming a material film having a light shielding function on the phase shifter film; forming a material film pattern and a phase shifter pattern by etching the material film and the phase shifter film; forming a phase shifting groove by etching the substrate using the material film pattern and the phase shifter pattern as an etching mask; and completing a light shielding film pattern by further patterning the material film pattern on the phase shifter pattern.

In the manufacturing method of the half-tone phase shift mask, it is preferable that the step of forming a phase shifter film comprises the step of forming the phase shifter film with a material selected from the group consisting of MoSiON, SiN$_x$, amorphous carbon, and CrF to a thickness d to have a transmittance of 5 to 30% T against the exposure light. Here, preferably, the thickness d is determined by the following equation: $d=-\lambda \ln T/4\pi k$, wherein "k" denotes an extinction coefficient of the exposure light, and "$\lambda$" denotes a wavelength of the exposure light.

Also, the step of forming the phase shifting groove comprises the step of forming the phase shifting groove to a depth of D so that a phase difference ($\Delta\Phi$) between exposure light passing through the phase shifting groove and that passing through the phase shifter pattern ranges between 90° and 270°. Here, the depth D is determined by the following equation: $D=\{\lambda/2(N-1)\}-\{2(n-1)d/2(N-1)\}$, wherein "N" is a refractive index of the substrate, "n" is a refractive index of the phase shifter pattern, "$\lambda$" is a wavelength of exposure light, and "d" is a thickness of the phase shifter pattern.

It is preferable that the step of forming a material film having a light shielding function comprises the step of forming the material film having a light shielding function with a material selected from the group consisting of chromium (Cr), aluminum (Al) and MoSi.

PSMs according to the present invention can increase transmittance sufficiently, compared to the conventional PSM. The depth of the phase shifting groove formed by etching the transparent substrate of the PSM according to the present invention need not be deep so that a surface thereof can be uniformly formed. Therefore, a fine pattern having an improved contrast may be formed using a short wavelength light source.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
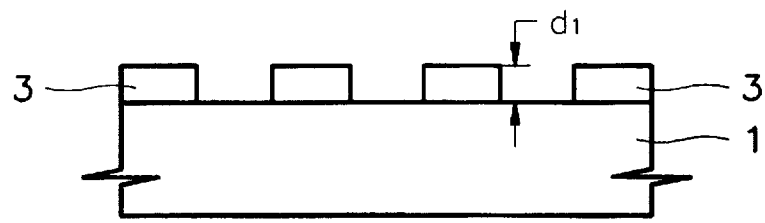
FIG. 1 is a sectional view of a conventional half-tone PSM having an MoSiON half-tone phase shifter.
Figure 2:
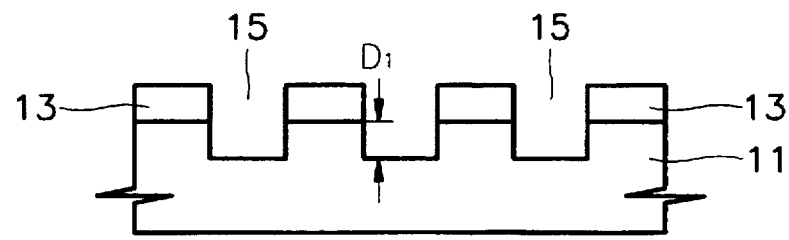
FIG. 2 is a sectional view of a conventional half-tone PSM having a chromium film pattern and a phase shifting groove formed thereon.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

<First Embodiment of half-tone PSM>

Figure 3:
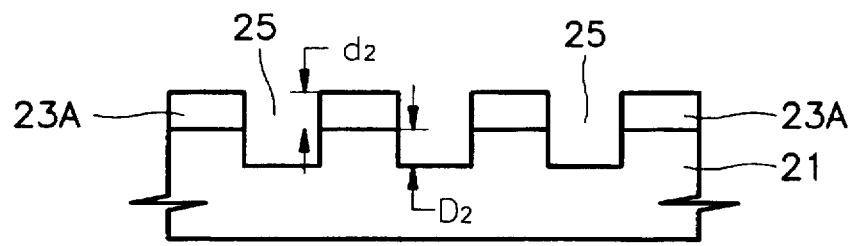
FIG. 3 is a sectional view of a half-tone PSM according to a first embodiment of the present invention.

Referring to FIG. 3, a phase shifter 23A having a thickness of d2 is formed on a transparent substrate 21. A phase shifting grove 25 is formed by etching the substrate 21 to a depth of D2.

In the half-tone PSM, the transmittance is adjusted by controlling the thickness d2 of the phase shifter 23A, and a phase shift value is adjusted between 90° and 270° by controlling the depth D2 of the phase shifting groove 25. Preferably, the phase shift value is adjusted to an angle of 180°.

Also, it is preferable that the phase shifter 23A is formed of a material selected of MoSiON, SiN$_x$, amorphous carbon, and CrF, and that light transmittance thereof ranges between 5 and 30%. More preferably, light transmittance thereof ranges between 5 and 15%.

The thickness d2 of the phase shifter 23A and the depth D2 of the phase shifting groove 25 which are appropriate for the present invention can be calculated in the following ways.

First, since the transmittance T1 and thickness d1 of the phase shifter 3 (see FIG. 1) in the conventional half-tone PSM are known, by substituting the values T1 and d1 in Equation 2, an extinction coefficient k of light of the phase shifter is obtained in the following equation:

$$k=-(\lambda \ln T1/4\pi d1)$$

When the obtained value k and the desired transmittance T2 (which is greater than T1) are again substituted in Equation 2, the thickness d2 of the phase shifter 23A of the present invention is obtained as follows:

$$d2=d1 \ln T2/\ln T1$$

Also, when the thickness d2 is substituted in Equation 1, the degree of the phase shift (ΔΦ1) can be obtained as follows:

$$\Delta\Phi 1 = 2\pi(n-1)d2/\lambda = 2\pi(n-1)d1\ln T2/\ln T1 \lambda$$

Since the transmittance is increased from T1 to T2, the thickness d2 of the phase shifter is reduced compared to the thickness d1 of the conventional phase shifter causing a phase shift of 180°. Thus, the value (ΔΦ1) of the phase shift is also reduced below 180°. The substrate is etched to a depth of D2 to regulate the reduced value of the phase shift to 180°. The etching depth D2 of the substrate is calculated as follows by substituting a refractive index N of the substrate in Equation 1:

$$\Delta\Phi 2 = (\pi - \Delta\Phi 1) = 2\pi(N-1)D2/\lambda$$

$$D2 = \{\lambda/2(N-1)\} - \{2(n-1)d2/2(N-1)\}$$

At this time, the etching depth D2 of the substrate is reduced by $2(n-1)d2/2(N-1)$ compared to the etching depth D1 $(=\lambda/2(N-1))$ of the conventional half-tone PSM.

That is, if the extinction coefficient k of light, or thickness d1 and transmittance T1 against exposure light of the conventional phase shifter pattern formed of the same material are given, the thickness d2 of the half-tone phase shift pattern 23A having the desired transmittance T2 according to the present invention can be easily determined by Equation 3 and the etching depth D2 of the substrate by Equation 4.

$$d2 = -\lambda \ln T2/4\pi k = d1 \ln T2/\ln T1 \quad \text{Equation 3}$$

$$D2 = \{\lambda/2(N-1)\} - \{2(n-1)d2/2(N-1)\} \quad \text{Equation 4}$$

wherein, d1 denotes the thickness of a conventional phase shifter pattern; d2 denotes the thickness of a phase shifter pattern according to the present invention; T1 denotes the transmittance of the conventional phase shifter pattern; T2 denotes the transmittance of the phase shifter pattern according to the present invention; n denotes a refractive index of the phase shifter pattern according to the present invention; N denotes a refractive index of the substrate according to the present invention; and λ denotes a wavelength of exposure light.

For example, the thickness of an MoSiON phase shifter pattern with the transmittance of 5% in a half-tone phase shift mask for a currently used DUV is 1350 Å. Therefore, the thickness of the MoSiON phase shifter pattern and the etching depth of a substrate which are appropriate for forming a half-tone PSM having the transmittance of 8% are calculated from Equations 3 and 4, resulting in 1138Å and about 390 Å, respectively.

The half-tone PSM formed through the above process can have high transmittance against exposure light having a short wavelength such as DUV light source of 248 nm. Also, since the depth of the etched substrate is shallower than that of the conventional half-tone PSM, the surface of the phase shifting groove can be uniformly formed. Accordingly, when a photolithography process is conducted using the half-tone PSM according to the present invention, a phase difference between light passing through the shifter pattern and that passing through the substrate on which the shifter pattern is not formed can become 180° uniformly. Thus, offset interference occurs at the edge of the shifter pattern, thereby forming a fine pattern having an improved contrast.

<Second Embodiment of half-tone PSM>

Figure 4:
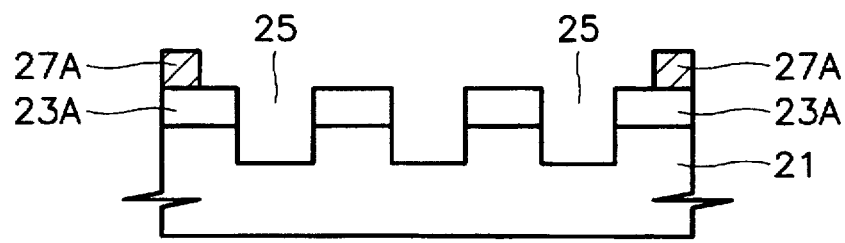
FIG. 4 is a sectional view of a half-tone PSM according to a second embodiment of the present invention.

FIG. 4 shows a half-tone PSM according to a second embodiment of the present invention. The same reference numerals as those of FIG. 3 denote the same members. Reference numeral 27A denotes a light shielding film pattern.

The half-tone PSM according to the second embodiment is different from that according to the first embodiment shown in FIG. 3 in that it is further provided with the light shielding film pattern 27A formed on a predetermined area of the phase shifter 23A. The reason why the light shielding film pattern 27A is further formed is as follows.

When only the phase shifter 23A is formed as shown in FIG. 3, light can be slightly transmitted through the phase shifter 23A. Accordingly, if photoresist corresponding to the transmitting portion has a step, irregular reflection may be generated, which may result in undesirable exposure of the photoresist.

Also, when a pattern is repeatedly formed on a wafer by relatively changing a position of the half-tone PSM with respect to the wafer, a photoresist portion corresponding to the edge of the half-tone PSM may be overlapped. Accordingly, light passing through the edge portion may be repeatedly irradiated to the photoresist so that the undesired portion of photoresist is exposed.

Thus, the unnecessary exposure of the photoresist can be prevented by forming the light shielding film pattern 27A on a predetermined area of the phase shifter 23A.

It is preferable that the light shielding film pattern 27A is formed of a material selected of chromium, aluminum, and MoSi to have the transmittance between 0 and 30% against a light source.

The reason why the light shielding film pattern 27A is not required to be completely opaque is that, since only a small amount of light transmits the phase shifter pattern 23A and then transmits the light shielding film pattern 27A, the light does not finally reach the photoresist though the light shielding film pattern 27A is not opaque.

<Method for fabricating a half-tone PSM>

Figure 5:
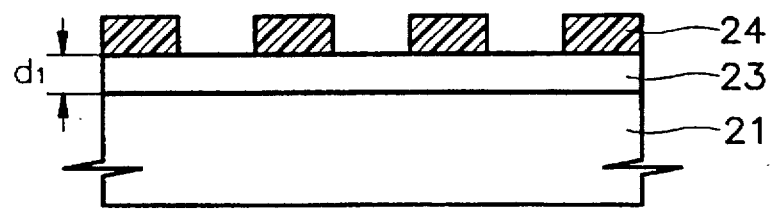
FIGS. 5 to 7 are sectional views for explaining a method for fabricating the half-tone PSM shown in FIG. 3.
Figure 6:
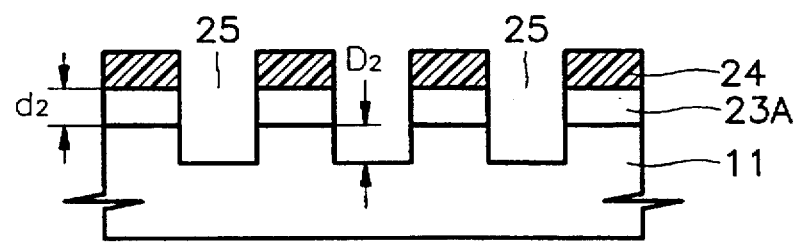
Figure 7:
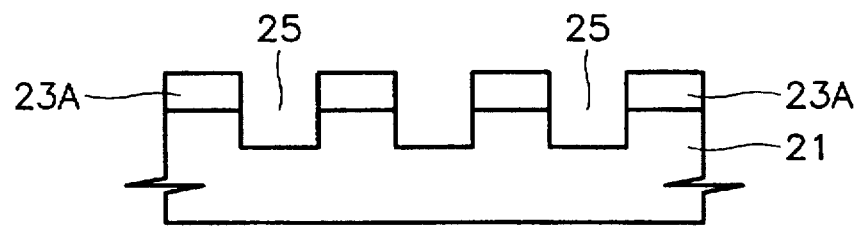

FIGS. 5 to 7 are sectional views for illustrating a method for fabricating the half-tone PSM shown in FIG. 3.

Referring to FIG. 5, a phase shifter film 23 having a thickness of d2 is formed on a transparent substrate 21. A photoresist pattern 24 for forming a phase shifter pattern is formed on the phase shifter film 23. It is preferable that the phase shifter film 23 is formed of a material selected of MoSiON, SiN$_x$, amorphous carbon, and CrF. Preferably, the light transmittance with the thickness d2 of the phase shifter 23 ranges between 5 and 30%, and more preferably, between 5 and 15%.

Referring to FIG. 6, the phase shifter film 23 is etched using the photoresist pattern 24 as an etching mask, thereby forming a phase shifter pattern 23A. Then, the transparent substrate 21 is etched with a depth of D2 using the photoresist pattern 24 and the phase shifter pattern 23A as an etching mask, thereby forming a phase shifting groove 25.

Finally, the photoresist pattern 24 is removed as shown in FIG. 7, thereby completing the formation of the half-tone PSM having improved transmittance against exposure light and uniformity.

FIGS. 8 to 12 are sectional views for illustrating a method for fabricating the half-tone PSM shown in FIG. 4. The same reference numerals as those of FIGS. 5 to 7 denote the same members.

Figure 8:
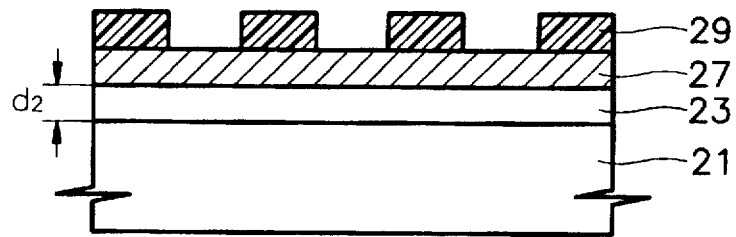
FIGS. 8 to 12 are sectional views for explaining a method for fabricating the half-tone PSM shown in FIG. 4.

Referring to FIG. 8, a phase shifter film 23 and a material film 27 are sequentially formed on a transparent substrate 21. Then, a first photoresist pattern 29 is formed on the material film 27. Here, it is preferable that the phase shifter film 23 is formed of a material selected of MoSiON, SiN$_x$, amorphous carbon, and CrF. Preferably, the light transmittance with the thickness d2 of the phase shifter 23 ranges between 5 and 30%, and more preferably, between 5 and 15%. Also, it is preferable that the material film 27 is formed of a material selected of chromium, aluminum, and MoSi and has transmittance between 0 and 30% against exposure light.

Figure 9:
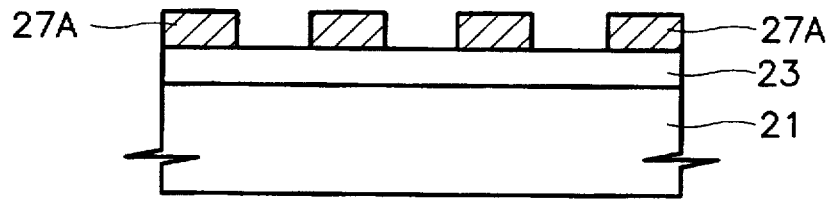

Referring to FIG. 9, the material film 27 is patterned using the first photoresist pattern 29 as an etching mask, thereby forming a material film pattern 27A. Thereafter, the first photoresist pattern 29 is removed.

Figure 10:
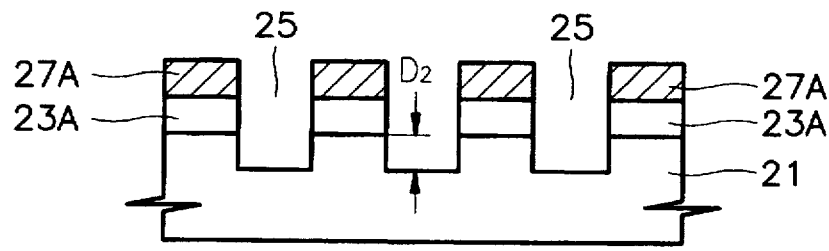

Referring to FIG. 10, the phase shifter film 23 is patterned using the material film pattern 27A as an etching mask, thereby forming a phase shifter pattern 23A. Then, the transparent substrate 21 is etched to a depth of D2 to thereby form a phase shifting groove 25.

Figure 11:
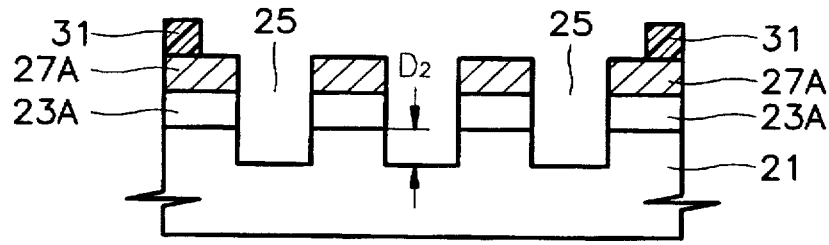

Referring to FIG. 11, a second photoresist pattern 31 defining a light shielding film pattern is formed on the material film pattern 27A.

Figure 12:

Finally, as shown in FIG. 12, the material film pattern 27A is etched using the second photoresist pattern 31 as an etching mask, thereby forming a light shielding film pattern 27B. Then, the second photoresist pattern 31 is removed, thereby completing the formation of the half-tone PSM.

As described above, in half-tone PSMs according to the present invention, since the thickness of the shifter can be easily adjusted, transmittance of light passing through the shifter can be increased. Also, since the etching depth of the substrate can be shallow, a phase shifting groove having a uniform surface can be formed. Thus, when half-tone PSMs according to the present invention are employed, a photolithography process can be performed using a light source having a short wavelength. Furthermore, since a correct phase shift effect can be achieved, a fine pattern having an improved contrast can be formed.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A phase shift mask comprising:
   a substrate which is transparent with respect to exposure light, the substrate including a substrate surface;
   a semitransparent phase shifter pattern on the transparent substrate surface wherein the phase shifter pattern is semitransparent with respect to the exposure light; and
   a transparent phase shifting groove in the transparent substrate between the semitransparent phase shifter pattern, the phase shifting groove having a transparent phase shifting groove floor beneath the substrate surface, the phase shifting floor being transparent to the exposure light.

2. A phase shift mask as claimed in claim 1, wherein the semitransparent phase shifter pattern is of a thickness d to have a transmittance between 5 and 30% T against the exposure light.

3. A phase shift mask as claimed in claim 2, wherein the thickness d is determined by the following equation:

$$d = -\lambda \ln T / 4\pi k,$$

wherein "k" denotes an extinction coefficient of the exposure light by the semitransparent phase shifter pattern, and "$\lambda$" denotes a wavelength of the exposure light.

4. A phase shift mask as claimed in claim 1, wherein the semitransparent phase shifter pattern is formed of a material selected from the group consisting of MoSiON, SiN$_x$, amorphous carbon, and CrF.

5. A phase shift mask as claimed in claim 2, wherein the transparent phase shifting groove floor is of a depth of D from the substrate surface so that a phase difference ($\Delta\Phi$) between exposure light passing through the phase shifting groove floor and that passing through the semitransparent phase shifter pattern ranges between 90° and 270°.

6. A phase shift mask as claimed in claim 5, wherein the transparent phase shifting groove is of a depth of D so that a phase difference ($\Delta\Phi$) between exposure light passing through the transparent phase shifting groove floor and that passing through the semitransparent phase shifter pattern is 180°.

7. A phase shift mask as claimed in claim 5, wherein the depth D is determined by the following equation:

$$D = \{\lambda/2(N-1)\} - \{2(n-1)d/2(N-1)\},$$

wherein "N" is a refractive index of the substrate, "n" is a refractive index of the semitransparent phase shifter pattern, "$\lambda$" is a wavelength of exposure light, and "d" is a thickness of the semitransparent phase shifter pattern.

8. A phase shift mask as claimed in claim 1, further comprising a light shielding film pattern on a predetermined area of the semitransparent phase shifter pattern.

9. A phase shift mask as claimed in claim 8, wherein the light shielding film pattern has a transmittance of 5 to 30% T against the exposure light.

10. A phase shift mask as claimed in claim 8, wherein the light shielding film pattern is formed of a material selected from the group consisting of chromium (Cr), aluminum (Al) and MoSi.

11. A method for fabricating a phase shift mask, comprising the steps of:
   forming a semitransparent phase shifter pattern on a surface of a substrate which is transparent with respect to exposure light, the semitransparent phase shifter pattern being semitransparent with respect to the exposure light; and
   forming a transparent phase shifting groove in the substrate surface by etching the substrate surface using the phase shifter pattern as an etching mask.

12. A method for fabricating a phase shift mask as claimed in claim 11, wherein the step of forming a semitransparent phase shifter pattern comprises the step of:
   forming the semitransparent phase shifter pattern to a thickness d to have a transmittance of 5 to 30% T against the exposure light.

13. A method for fabricating a phase shift mask as claimed in claim 12, wherein the thickness d is determined by the following equation:

$$d = -\lambda \ln T / 4\pi k,$$

wherein "k" denotes an extinction coefficient of the exposure light, and "$\lambda$" denotes a wavelength of the exposure light.

14. A method for fabricating a phase shift mask as claimed in claim 12, wherein the step of forming a transparent phase shifting groove comprises the step of:
   forming the transparent phase shifting groove to a depth of D from the substrate surface so that a phase difference ($\Delta\Phi$) between exposure light passing through the transparent phase shifting groove and that passing through the semitransparent phase shifter pattern ranges between 90° and 270°.

15. A method for fabricating a phase shift mask as claimed in claim 14, wherein the step of forming a transparent phase shifting groove comprises the step of:

forming the transparent phase shifting groove to a depth of D from the substrate surface so that a phase difference (ΔΦ) between exposure light passing through the transparent phase shifting groove and that passing through the semitransparent phase shifter pattern is 180°.

16. A method for fabricating a phase shift mask as claimed in claim 14, wherein the depth D from the substrate surface is determined by the following equation:

$$D=\{\lambda/2(N-1)\}-\{2(n-1)d/2(N-1)\},$$

wherein "N" is a refractive index of the substrate, "n" is a refractive index of the phase shifter pattern, "λ" is a wavelength of exposure light, and "d" is a thickness of the phase shifter pattern.

17. A method for fabricating a phase shift mask as claimed in claim 11, wherein the step of forming a semitransparent phase shifter pattern comprises the step of:

forming the semitransparent phase shifter pattern with a material selected from the group consisting of MoSiON, $SiN_x$, amorphous carbon, and CrF.

18. A method for fabricating a phase shift mask, comprising the steps of:

forming a semitransparent phase shifter film on a substrate which is transparent with respect to exposure light;

forming a material film having a light shielding function on the phase shifter film;

forming a material film pattern by patterning the material film;

forming a semitransparent phase shifter pattern by etching the semitransparent phase shifter film using the material film pattern as an etchings mask;

forming a transparent phase shifting groove by etching the transparent substrate using the material film pattern and the semitransparent phase shifter pattern as an etching mask; and completing a light shielding film pattern by further patterning the material film pattern on the semitransparent phase shifter pattern.

19. A method for fabricating a phase shift mask as claimed in claim 18, wherein the step of forming a semitransparent phase shifter film comprises the step of:

forming the semitransparent phase shifter film with a material selected from the group consisting of MoSiON, $SiN_x$, amorphous carbon, and CrF.

20. A method for fabricating a phase shift mask as claimed in claim 18, wherein the step of forming a material film having a light shielding function comprises the step of:

forming the material film having a light shielding function with a material selected from the group consisting of chromium (Cr), aluminum (Al) and MoSi.

21. A method for fabricating a phase shift mask as claimed in claim 18, wherein the step of forming a semitransparent phase shifter film comprises the step of:

forming the phase shifter film to a thickness d to have a transmittance of 5 to 30% T against the exposure light.

22. A method for fabricating a phase shift mask as claimed in claim 21, wherein the thickness d is determined by the following equation:

$$d=-\lambda lnT/4\pi k,$$

wherein "k" denotes an extinction coefficient of the exposure light, and "λ" denotes a wavelength of the exposure light.

23. A method for fabricating a phase shift mask as claimed in claim 18, wherein the step of forming the transparent phase shifting groove comprises the step of:

forming the transparent phase shifting groove to a depth of D from the substrate surface so that a phase difference (ΔΦ) between exposure light passing through the transparent phase shifting groove and that passing through the semitransparent phase shifter pattern ranges between 90° and 270°.

24. A method for fabricating a phase shift mask as claimed in claim 23, wherein the step of forming the transparent phase shifting groove for phase shifting comprises the step of:

forming the transparent phase shifting groove to a depth of D from the substrate surface so that a phase difference (ΔΦ) between exposure light passing through the transparent phase shifting groove and that passing through the semitransparent phase shifter pattern is 180°.

25. A method for fabricating a phase shift mask as claimed in claim 23, wherein the depth D is determined by the following equation:

$$D=\{\lambda/2(N-1)\}-\{2(n-1)d/2(N-1)\},$$

wherein "N" is a refractive index of the substrate, "n" is a refractive index of the semitransparent phase shifter pattern, "λ" is a wavelength of exposure light, and "d" is a thickness of the semitransparent phase shifter pattern.

* * * * *